(12) United States Patent
Bai et al.

(10) Patent No.: US 11,280,681 B2
(45) Date of Patent: Mar. 22, 2022

(54) FLEXIBLE TEMPERATURE SENSOR, METHOD FOR PREPARING THE SAME AND FLEXIBLE DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Jinchao Bai, Beijing (CN); Xun Wang, Beijing (CN); Zumou Wu, Beijing (CN); Xiaolong Li, Beijing (CN); Tianyu Zuo, Beijing (CN); Xiangqian Ding, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 330 days.

(21) Appl. No.: 16/563,110

(22) Filed: Sep. 6, 2019

(65) Prior Publication Data
US 2020/0225097 A1 Jul. 16, 2020

(30) Foreign Application Priority Data
Jan. 14, 2019 (CN) .......................... 201910032972.1

(51) Int. Cl.
*G01K 7/00* (2006.01)
*H01B 1/14* (2006.01)
(Continued)

(52) U.S. Cl.
CPC ................ *G01K 7/00* (2013.01); *H01B 1/22* (2013.01); *H01B 1/24* (2013.01); *H01L 51/0097* (2013.01)

(58) Field of Classification Search
CPC ... G01K 7/00; G01K 7/16; H01B 1/16; H01B 1/18; H01L 51/0097; A61B 5/01;
(Continued)

(56) References Cited

U.S. PATENT DOCUMENTS

| | | | |
|---|---|---|---|
| 7,497,993 B1 * | 3/2009 | Baker | G01K 11/20 422/504 |
| 2016/0338206 A1 | 11/2016 | Yang et al. | |
| 2017/0048972 A1 | 2/2017 | Park et al. | |

FOREIGN PATENT DOCUMENTS

| | | |
|---|---|---|
| CN | 103681001 A | 3/2014 |
| CN | 104934551 A | 9/2015 |

(Continued)

OTHER PUBLICATIONS

Liao et al "Flexible Organic Electronics in Biology: Materials and Devices", Adv. Mater. 2015, 27, 7493-7527.*
(Continued)

*Primary Examiner* — Mark Kopec
(74) *Attorney, Agent, or Firm* — Brooks Kushman P.C.

(57) ABSTRACT

The present disclosure relates to a flexible temperature sensor, a method for preparing the same, and a flexible device. The flexible temperature sensor includes: a flexible substrate; an electrode arranged on the flexible substrate; a mixed fluid arranged on the flexible substrate and in contact with the electrode, in which the mixed fluid includes an ionic liquid and porous conductive particles; and a protective plate arranged on a surface of the flexible substrate having the mixed fluid to protect the mixed fluid.

20 Claims, 4 Drawing Sheets

(51) Int. Cl.
    *B05D 5/00*           (2006.01)
    *H01B 1/24*           (2006.01)
    *H01L 51/00*          (2006.01)
    *H01B 1/22*           (2006.01)

(58) Field of Classification Search
    CPC .. B32B 37/12; B05D 1/02; B05D 5/00; B05D 2201/02
    See application file for complete search history.

(56) References Cited

FOREIGN PATENT DOCUMENTS

| | | |
|---|---|---|
| CN | 106448823 A | 2/2017 |
| JP | 2012007963 A | 1/2012 |
| KR | 20180087044 A | 8/2018 |

OTHER PUBLICATIONS

Jiang et al "Ionic liquid enabled flexible transparent polydimethylsiloxane sensors for both strain and temperature sensing", Advanced Composites and Hybrid Materials (2021) 4:574-583.*
Yoon et al "Microfluidic capacitive sensors with ionic liquid electrodes and CNT/PDMS nanocomposites for simultaneous sensing of pressure and temperature", J. Mater. Chem. C, 2017, 5, 1910.*
First Office Action for Chinese Application No. 201910032972.1, dated Apr. 13, 2020, 8 Pages.

\* cited by examiner

FLEXIBLE TEMPERATURE SENSOR, METHOD FOR PREPARING THE SAME AND FLEXIBLE DEVICE

CROSS-REFERENCE TO RELATED APPLICATION

This application claims priority to Chinese Patent Application No. 201910032972.1 filed on Jan. 14, 2019, which is incorporated herein by reference in its entirety.

TECHNICAL FIELD

The present disclosure relates to the field of sensor technology, in particular, to a flexible temperature sensor, a method for preparing the flexible temperature sensor, and a flexible device including the flexible temperature sensor.

BACKGROUND

With the growing popularity of the concept of the Internet of Things, the sensor market is welcoming a rapid development opportunity. A temperature sensor is an important class of sensors, accounting for more than 15% of the total sensor demand. Therefore, the market for the temperature sensor is vast. The thermal resistance type temperature sensor is a commonly used temperature sensor product, which utilizes the principle that the resistance value of a conductor or a semiconductor changes with temperature, and has advantages of stable performance, flexible use, and high reliability.

SUMMARY

In one aspect, the present disclosure provides a flexible temperature sensor, including: a flexible substrate; an electrode arranged on the flexible substrate; a mixed fluid arranged on the flexible substrate and in contact with the electrode, in which the mixed fluid includes an ionic liquid and porous conductive particles; and a protective plate arranged on a surface of the flexible substrate having the mixed fluid to protect the mixed fluid.

Optionally, the porous conductive particles are two-dimensional graphene-like titanium carbide particles, graphene particles, carbon nanotube particles, or hollow spherical nickel particles.

Optionally, the ionic liquid is at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate.

Optionally, the flexible substrate includes a polymer substrate, an ultra-thin glass substrate, a stainless steel substrate, a paper substrate or a biological composite substrate.

Optionally, the electrode is a metal film in a shape of comb, plate or well deposited on the flexible substrate.

Optionally, the metal film includes a molybdenum film, an aluminum film, a copper film or a silver film.

Optionally, the protective plate includes a polymer substrate, an ultra-thin glass substrate, a stainless steel substrate, a paper substrate or a biological composite substrate.

Optionally, a retaining wall is arranged on the flexible substrate, and the mixed fluid is placed in a region surrounded by the retaining wall.

Optionally, the flexible temperature sensor further includes a chip coupled to the electrode and for measuring current and processing the relationship between temperature and current.

In another aspect, the present disclosure provides a method for preparing the flexible temperature sensor according to any of the above embodiments, including: depositing a metal film on the flexible substrate, and performing exposure and etching to form an electrode; inkjet printing or spraying the mixed fluid onto the flexible substrate and contacting the mixed fluid with the electrode; and attaching a protective plate to the flexible substrate.

Optionally, the protective plate and the flexible substrate are bonded by an adhesive.

Optionally, the method further includes binding a chip on the electrode.

Optionally, the chip is coupled to the electrode by a conductive paste.

Optionally, the ionic liquid is mixed with the porous conductive particles under vacuum.

Optionally, the porous conductive particles are two-dimensional graphene-like titanium carbide particles, graphene particles, carbon nanotube particles, or hollow spherical nickel particles.

Optionally, the ionic liquid is at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate.

Optionally, a retaining wall is arranged on the flexible substrate, and the mixed fluid is placed in a region surrounded by the retaining wall.

In still another aspect, the present disclosure provides a flexible device including the flexible temperature sensor according to any of the above embodiments.

DETAILED DESCRIPTION

Figure 1:
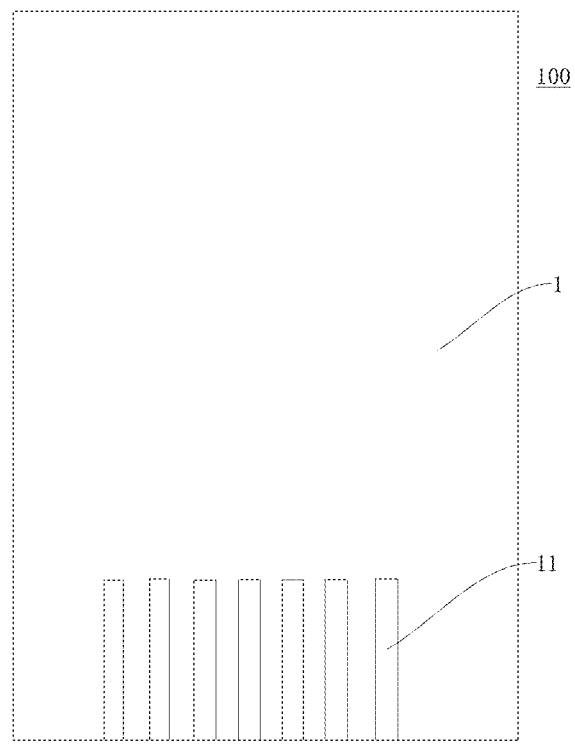
FIG. 1 is a schematic view showing a flexible temperature sensor according to an embodiment of the present disclosure.

Various embodiments of the present disclosure are described in detail below with reference to the drawings.

The embodiments are illustrated in the drawings, in which the same or similar reference numerals are used to refer to the same or similar elements or elements, or have the same or similar functions. The embodiments described below with reference to the drawings are merely illustrative of the technical solutions of the present disclosure, but are not to be construed as limiting to the technical solutions of the present disclosure.

At present, most of the thermal resistance temperature sensors are made of metal materials, and the most commonly used thermal resistances are platinum thermal resistance and copper thermal resistance. However, these sensors are made of a non-flexible material, such that only the temperature of objects with a flat surface can be measured; and are not biocompatible, and thus requires an additional sensor package. Further, the flexible temperature sensor of the related art has problems that the preparation is complicated and the detection sensitivity is very low.

The present disclosure is directed to solving at least one of the above technical problems in the related art. To this end, an object of the present disclosure is to provide a flexible temperature sensor and a flexible device including the flexible temperature sensor, in which the flexible temperature sensor or the flexible device are flexible, and capable of measuring an object having an uneven surface, and have a high detection sensitivity and an excellent biocompatibility. Further, the present disclosure provides a method for preparing the above flexible temperature sensor, in which the method can be made of a flexible material and is simple to be manufactured.

According to an embodiment of the present disclosure, the present disclosure provides a flexible temperature sensor, including: a flexible substrate; an electrode arranged on the flexible substrate; a mixed fluid arranged on the flexible substrate and in contact with the electrode, in which the mixed fluid includes an ionic liquid and porous conductive particles; and a protective plate arranged on a surface of the flexible substrate having the mixed fluid to protect the mixed fluid.

The flexible temperature sensor according to an embodiment of the present disclosure may have the following advantageous technical effects: the preparation of a flexible temperature sensor is facilitated by providing a mixed fluid including an ionic liquid and porous conductive particles on a flexible substrate, which is advantageous for achieving an accurate temperature detection; and the fluidity of the mixed fluid ensures its continuity in a certain region, and there is no breakage when stretched and bent, and thus it can be used for the design of a flexible device.

A flexible temperature sensor 100 according to an embodiment of the present disclosure is described below in conjunction with the drawings.

As shown in FIGS. 1 to 4, a flexible temperature sensor 100 according to an embodiment of the present disclosure includes a flexible substrate 1, an electrode 11 arranged on the flexible substrate 1, a mixed fluid 2, and a protective plate 3.

Specifically, an electrode 11 is arranged on the flexible substrate 1. The mixed fluid 2 is arranged on the flexible substrate 1 and in contact with the electrode 11, and the mixed fluid 2 includes an ionic liquid and porous conductive particles. The protective plate 3 is arranged on a surface of the flexible substrate 1 having the mixed fluid 2 to protect the mixed fluid 2.

For example, an electrode 11 may be arranged on the flexible substrate 1. The mixed fluid 2 is arranged on the flexible substrate 1, and the mixed fluid 2 may be placed on the flexible substrate 1 by inkjet printing or spraying. The mixed fluid 2 is in contact with the electrode 11, so that an electrical connection between the mixed fluid 2 and the electrode 11 can be achieved. The mixed fluid 2 includes an ionic liquid and porous conductive particles. The protective plate 3 is arranged on a surface of the flexible substrate 1 having the mixed fluid 2, so that the mixed fluid 2 can be protected by the protective plate 3.

The ratio of the ionic liquid to the porous conductive particles may be specifically set according to the flexible temperature sensor 100 of different sensitivity requirements. Optionally, the ratio of the ionic liquid to the porous conductive particles is in the range of 1:5 to 5:1. For example, the ratio of the ionic liquid to the porous conductive particles is 1:3, 1:2, 1:1, 3:1, 2:1 and the like.

The ionic liquid refers to a salt that is liquid at room temperature or near room temperature and is completely composed of an anion or a cation, and is also called a low temperature molten salt. The ionic liquid has the following advantages: non-volatile, non-flammable, strong electrical conductivity, large heat capacity, small vapor pressure, stable nature, and good solubility to many inorganic salts and organic substances. Therefore, ionic liquids are widely used in the fields of electrochemistry, organic synthesis, catalysis, separation and the like. The conductivity of some ionic liquids is sensitive to temperature, and the electrical conductivity changes significantly with temperature. Therefore, it can be used for accurate temperature detection. The ionic liquid is used as a fluid, and its fluidity ensures its continuity in a certain region and there is no breakage when stretched and bent. Therefore, it can be used for the design and the manufacturing of the flexible device 200 (for example, a medical detecting device or a wearing device).

The porous conductive particles have a remarkable porous structure. First, the porous conductive particles may be in sufficient contact with the ionic liquid; second, the porous conductive particles, preferably porous black conductive particles may form a black body cavity effect, efficiently absorb heat, and transfer heat to the ionic liquid in time. The so-called black body cavity effect refers to that if, in a cavity having relatively high absorption on the inner surface there, the size of the small pores in the wall surface of the cavity is small enough as compared with that of the cavity, the radiation energy entering the cavity through the small pores is almost completely absorbed after being repeatedly absorbed and reflected by the wall surface of the cavity. That is, the absorption ratio of the small pores is equivalent to be approximate to 1, i.e., the cavity is close to a block body. These enhance the sensitivity of the ionic liquid to the external temperature change, and improve the accuracy of the detection.

In the flexible temperature sensor 100 according to an embodiment of the present disclosure, the flexible temperature sensor 100 is easily prepared by arranging the mixed fluid 2 including the ionic liquid and the porous conductive particles on the flexible substrate 1, which is advantageous for achieving accurate temperature detection; further, the mixed fluid 2 is used as a fluid, and its fluidity ensures its continuity in a certain region and there is no breakage when stretched and bent, and thus it can be used for the design of a flexible device 200.

According to some embodiments of the present disclosure, the ionic liquid may be mixed with the porous conductive particles under vacuum. Thus, the ionic liquid and the material of the porous conductive particles can be mixed more sufficiently by mixing the ionic liquid and the material of the porous conductive particles under vacuum, thereby facilitating the improvement of the detection sensitivity of the flexible temperature sensor 100. In some optional embodiments, the ionic liquid may also be mixed with the material of the porous conductive particles under non-vacuum.

Figure 6:
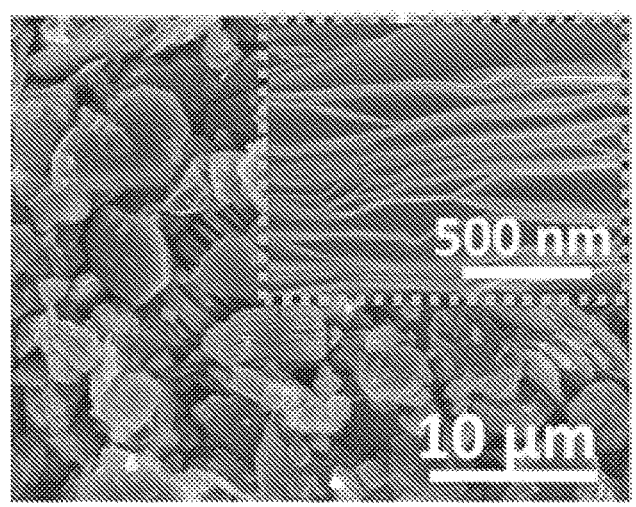
FIG. 6 is a schematic view showing a scanning electron micrograph of porous conductive particle titanium carbide in a flexible temperature sensor according to another embodiment of the present disclosure.

According to some embodiments of the present disclosure, the porous conductive particles may be, for example, two-dimensional graphene-like titanium carbide particles, graphene particles, carbon nanotube particles, or hollow spherical nickel particles, which are advantageous for ensuring the detection sensitivity of the flexible temperature sensor 100. For example, two-dimensional graphene-like titanium carbide ($Ti_3C_2$), which has metal conductivity and combines the excellent structure and chemical stability of ceramics, has broad potential as a storage electrode, a super capacitor, a Li-ion battery, and gas sensing, has been widely studied. The two-dimensional graphene-like titanium carbide solid particles are microscopically two-dimensionally sheet, are porous between the sheets, and have a large specific surface area as shown in FIG. 6.

The flexible temperature sensor 100 according to one embodiment of the present disclosure is mainly prepared using an ionic liquid and a plurality of layers of titanium carbide (for example, two-dimensional graphene-like titanium carbide). The present disclosure prepares a flexible temperature sensor 100 by inkjet printing a mixed fluid including an ionic liquid and two-dimensional graphene-like titanium carbide ($Ti_3C_2$) particles. The method has the advantages of simple preparation process and can prepare a flexible temperature sensor with high detection sensitivity. Therefore, it is suitable for long-term continuous temperature accurate measurement, and can be used for medical detection devices, wearable devices and the like.

According to some embodiments of the present disclosure, the ionic liquid may be at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate. For example, the ionic liquid may be any one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate or 1-ethyl-3-methylimidazolium acetate; or the ionic liquid may be a combination of two or more of the ionic liquid may be any one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate. It should be noted that the above description is only a few optional embodiments of the ionic liquid, and should not be construed as limiting the present disclosure.

Optionally, the flexible substrate 1 may include a polymer substrate, an ultra-thin glass substrate, a stainless steel substrate, a paper substrate or a biological composite substrate. Optionally, the protective plate 3 may include a polymer substrate, an ultra-thin glass substrate, a stainless steel substrate, a paper substrate or a biological composite substrate. The specific material type of the flexible substrate 1 and the protective plate 3 can be selected according to needs, which is advantageous for ensuring the flexibility of the flexible temperature sensor 100.

It should be noted that the ultra-thin glass substrate refers to a glass substrate with a thickness of 50 μm or less. The flexible substrate 1 and the protective plate 3 can be made of the same material. Of course, the flexible substrate 1 and the protective plate 3 can also be made of different materials.

Optionally, the electrode 11 may be a metal film deposited on the flexible substrate 1. Optionally, the electrode 11 may be an electrode in a shape of comb, plate or well. Optionally, the electrode 11 may have a thickness of 10 nm to 100 nm, and each of the electrodes may have a width of 10 μm to 50 μm. Optionally, the electrode 11 may be arranged on the peripheral region of a surface of the flexible substrate. Optionally, the metal film may include a molybdenum film, an aluminum film, a copper film or a silver film. The specific form of the metal film can be selected according to actual needs.

Figure 4:
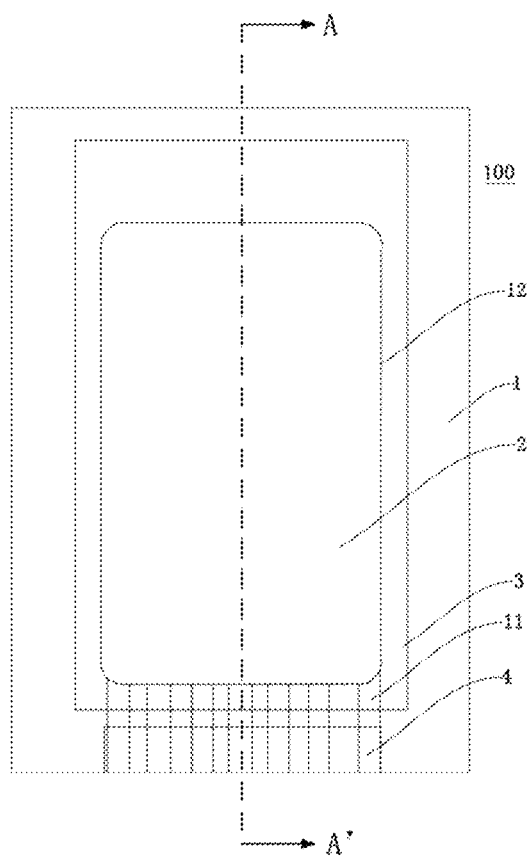
FIG. 4 is a schematic view showing a flexible temperature sensor according to a still another embodiment of the present disclosure.
Figure 5:
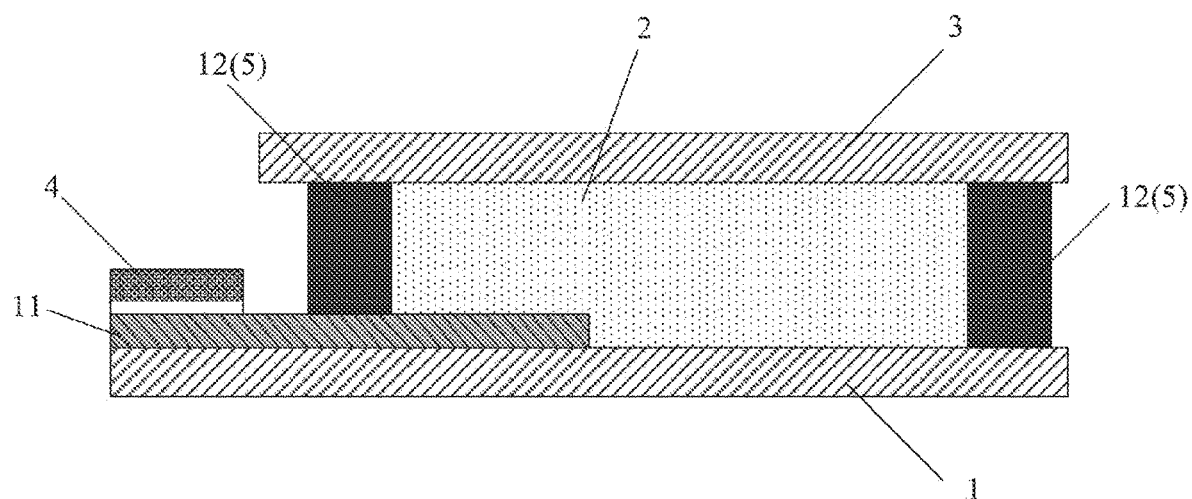
FIG. 5 is a sectional view showing the flexible temperature sensor along line A-A' in FIG. 4.

According to some embodiments of the present disclosure, as shown in FIG. 4, a retaining wall 12 may be arranged on the flexible substrate 1. The mixed fluid 2 is placed in the region surrounded by the retaining wall 12 to block the mixed fluid 2 from flowing out of the region. Optionally, the retaining wall may be made of acrylic-based resin or silicon nitride separately; or may be made of an adhesive material itself. Optionally, the retaining wall may have a height of 0.1 to 1 mm and a thickness of 2 μm to 10 μm. In some optional embodiments, the retaining wall 12 may be arranged on the flexible substrate 1 and cover the electrode so as to make the mixed fluid in the region surrounded by the retaining wall in contact with the electrode, as shown in FIG. 5. Optionally, the retaining wall 12 can be in a closed loop shape. Thus, an accommodation space can be defined inside the retaining wall 12, to facilitate the provision of the mixed fluid 2 in the accommodation space. The reliability of use of the flexible temperature sensor 100 can be also ensured by retaining wall 12 blocking the mixed fluid 2 from flowing out of the region. Of course, in some optional embodiments, there is no a retaining wall 12 arranged on the flexible substrate 1.

In some embodiments of the present disclosure, as shown in FIG. 4, the flexible temperature sensor 100 may further include a chip 4. The chip 4 is coupled to an electrode 11 for measuring current and processing the relationship between temperature and current. Therefore, the temperature monitoring is achieved by measuring the change in current via the chip 4 and processing the relationship between temperature and current via the chip 4.

Several specific embodiments of the flexible temperature sensor 100 according to the present disclosure are described in detail below in conjunction with the drawings.

Figure 2:
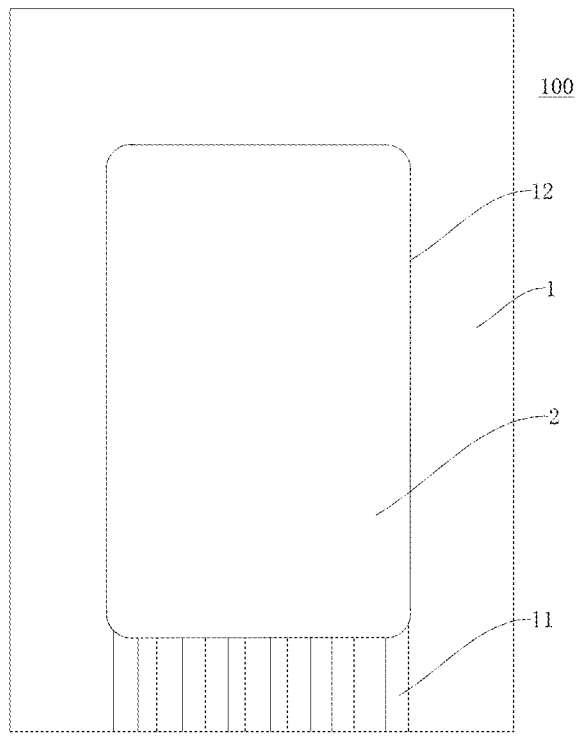
FIG. 2 is a schematic view showing a flexible temperature sensor according to another embodiment of the present disclosure.
Figure 3:
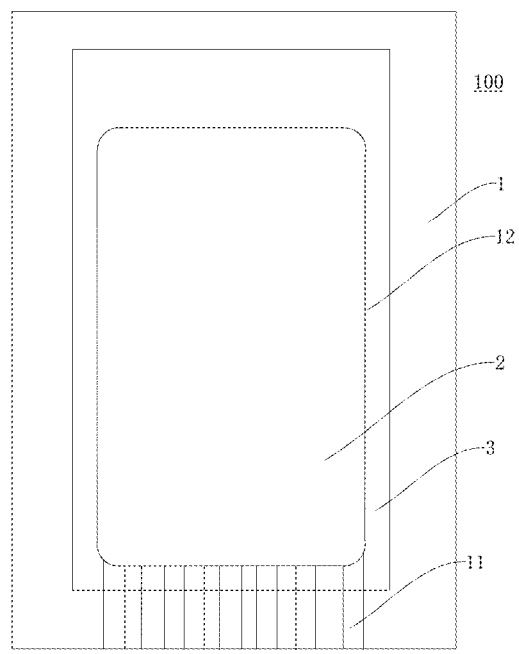
FIG. 3 is a schematic view showing a flexible temperature sensor according to a still another embodiment of the present disclosure.

As shown in FIG. 4 in conjunction with FIGS. 1 to 3, a flexible temperature sensor 100 according to an embodiment of the present disclosure includes a flexible substrate 1, a mixed fluid 2, a protective plate 3, an electrode 11, and a chip 4. Specifically, the electrode 11 is arranged on the flexible substrate 1; the mixed fluid 2 is arranged on the flexible substrate 1 and in contact with the electrode 11, in which the mixed fluid 2 includes an ionic liquid and porous conductive particles; and the protective plate 3 is arranged on a surface of the flexible substrate 1 having the mixed fluid 2 to protect the mixed fluid 2.

According to this embodiment of the present disclosure, the ionic liquid may be mixed with the porous conductive particles under vacuum. Thus, the ionic liquid and the material of the porous conductive particles can be mixed more sufficiently by mixing the ionic liquid and the material of the porous conductive particles under vacuum, which facilitates the improvement of the detection sensitivity of the flexible temperature sensor 100.

According to this embodiment of the present disclosure, the porous conductive particles may be, for example, two-dimensional graphene-like titanium carbide particles, graphene particles, carbon nanotube particles, or hollow spherical nickel particles. This is advantageous for ensuring the detection sensitivity of the flexible temperature sensor 100.

According to this embodiment of the present disclosure, the ionic liquid may be at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate.

Optionally, the flexible substrate 1 may include a polymer substrate, an ultra-thin glass substrate, a stainless steel substrate, a paper substrate or a biological composite substrate. Optionally, the protective plate 3 may include a polymer substrate, an ultra-thin glass substrate, a stainless steel substrate, a paper substrate or a biological composite substrate. The specific material type of the flexible substrate 1 and the protective plate 3 can be selected according to needs.

Optionally, the electrode 11 may be a metal film deposited on the flexible substrate 1. Optionally, the metal film may include a molybdenum film, an aluminum film, a copper film or a silver film. The specific form of the metal film can be selected according to actual needs.

In some embodiments of the present disclosure, as shown in FIG. 4, the chip 4 is coupled to an electrode 11 for measuring current and processing the relationship between temperature and current. Therefore, the chip 4 can measure the current, and process the relationship between temperature and current, thereby realizing temperature monitoring.

According to another embodiment of the present disclosure, a retaining wall 12 is arranged on the flexible substrate 1 of the flexible temperature sensor 100. Specifically, according to this embodiment of the present disclosure, as shown in FIG. 4, a retaining wall 12 may be arranged on the flexible substrate 1, and the mixed fluid 2 is placed in a region surrounded by the retaining wall 12 to block the mixed fluid 2 from flowing out of the region. For example, in some optional embodiments, the retaining wall 12 can be in a closed loop shape. Therefore, an accommodation space can be defined inside the retaining wall 12, to facilitate the provision of the mixed fluid 2 in the accommodation space.

Based on the above embodiments, it can be seen that the flexible temperature sensor according to the present disclosure has the following technical effects.

1. The conductivity of the ionic liquid increases significantly as the temperature increases, and can be used for accurate detection of temperature; and at the same time, the ionic liquid acts as a fluid, so that the temperature sensor 100 has flexible stretchability.

2. The porous conductive particles, such as two-dimensional graphene-like titanium carbide, are black endothermic conductive materials, and have a remarkable porous structure. Therefore, it is possible to sufficiently contact the ionic liquid, and to form a black body cavity effect, efficiently absorb heat, and transfer heat to the ionic liquid in time. This enhances the sensitivity of the ionic liquid to the external temperature change, and improve the accuracy of the detection.

3. The present disclosure prepares the flexible temperature sensor 100 by inkjet printing or spraying, which is advantageous for reducing the manufacturing cost and realizing large-area production.

Figure 7:
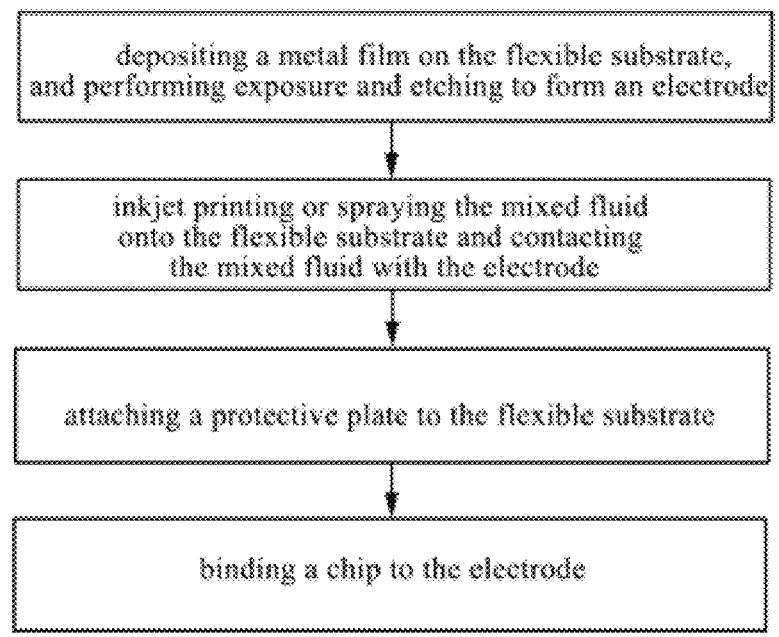
FIG. 7 is a flow chart showing a method for preparing a flexible temperature sensor according to another embodiment of the present disclosure.

As shown in FIG. 7, a method of preparing a flexible temperature sensor according to another embodiment of the present disclosure includes: depositing a metal film on a flexible substrate, and performing exposure and etching to form an electrode; inkjet printing or spraying the mixed fluid onto the flexible substrate and contacting the mixed fluid with the electrode; and attaching a protective plate to the flexible substrate. The method according to the present disclosure is simple in process and can be prepared on a large scale, whereby it can reduce the manufacturing cost.

Optionally, the protective plate 3 and the flexible substrate 1 may be bonded by an adhesive 5; or by arranging a retaining wall 12 between the protective plate 3 and the flexible substrate 1, specifically as shown in FIG. 5. A reliable connection between the protective plate 3 and the flexible substrate 1 can be achieved by the adhesive or a retaining wall, which ensures the reliability of use of the flexible temperature sensor.

For example, the flexible substrate may include a polymer substrate, an ultra-thin glass substrate, a stainless steel substrate, a paper substrate or a biological composite substrate. Optionally, the protective plate may include a polymer substrate, an ultra-thin glass substrate, a stainless steel substrate, a paper substrate or a biological composite substrate. Therefore, the specific material types of the flexible substrate and the protective plate can be selected according to needs, which is advantageous for ensuring the flexibility of the flexible temperature sensor 100.

It should be noted that the ultra-thin glass substrate refers to a glass substrate with a thickness of 50 μm or less. The flexible substrate and the protective plate can be made of the same material. Of course, the flexible substrate 1 and the protective plate 3 can also be made of different materials.

In an optional embodiment of the present disclosure, the method for preparing a flexible temperature sensor can also include bonding a chip on an electrode. In an optional embodiment of the present disclosure, the chip may be coupled to the electrode by a conductive paste. The temperature is monitored by measuring the magnitude of the current and processing the relationship between temperature and current through the chip.

Optionally, in the method for preparing a flexible temperature sensor of the present disclosure, the material of the porous conductive particles may be two-dimensional graphene-like titanium carbide.

Specifically, in step S1, a polymer substrate, an ultra-thin glass substrate, a stainless steel substrate, a paper substrate, a biological composite substrate, or the like is selected as a flexible substrate, and a film of a metal such as molybdenum (Mo), aluminum (Al), and copper (Cu) or silver (Ag) is deposited on the flexible substrate, and then exposure and etching are performed to from an electrode, as shown in FIG. 1.

In step S2, the ionic liquid is mixed with the two-dimensional graphene-like titanium carbide under vacuum, to sufficiently combine them to form a mixed fluid. Then, a mixed fluid including an ionic liquid and a two-dimensional graphene-like titanium carbide is inkjet printed or sprayed on the substrate on which step S1 is completed, to ensure that the mixed fluid is in contact with the electrode, as shown in FIG. 2.

Optionally, the ionic liquid may be at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate. The two-dimensional graphene-like titanium carbide is in an unexfoliated granular shape and has a remarkable multi-layered structure.

In step S3, a protective plate is attached on the substrate on which the step S2 is completed (as shown in FIG. 3), and the protective plate is optionally a polymer substrate, an ultra-thin glass substrate, a stainless steel substrate, a paper substrate, a biological composite substrate, and the like.

In step S4, a chip is bound to the substrate on which the step S3 is completed, as shown in FIG. 4. The chip is used to measure the magnitude of the current and to process the relationship between temperature and current, thereby monitoring the temperature.

The method for preparing the flexible temperature sensor in the case that the porous conductive particles are other materials, such as graphene particles, carbon nanotube particles or hollow spherical nickel particles, may be referred to the method for preparing the flexible temperature sensor in the case that the porous conductive particles are two-dimensional graphene-like titanium carbide, which will not be described herein.

Figure 8:
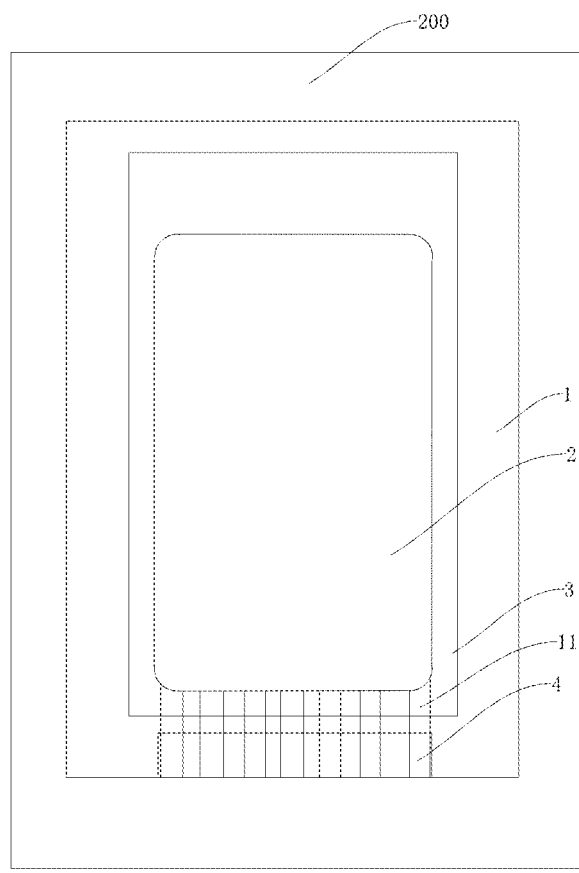
FIG. 8 is a schematic view showing a flexible device according to an embodiment of the present disclosure.

According to a further aspect of the present disclosure, as shown in FIG. 8, the flexible device 200 includes the above flexible temperature sensor 100. The flexible device 200 can be, for example, a medical detection device or a wearable device. The above flexible temperature sensor 100 is arranged on the flexible device 200, which is advantageous to improve the performance of the flexible device 200.

The flexible temperature sensor 100, other configurations and operations of the flexible device 200 according to embodiments of the present disclosure are well known to those skilled in the art and will not be described in detail herein.

In the description of the present disclosure, it should be noted that the terms the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. indicating the orientation or spatial relationship is based on the orientation or spatial relationship shown in the drawings, and are merely for the convenience of describing the present disclosure and the simplification of the description, rather than indicating or implying that the referred device or element must have a particular orientation, or be constructed and operated in a particular orientation. Thus, it should not be construed as a limitation on the present disclosure.

Although the present disclosure has shown and described some embodiments of the present disclosure, the technical solutions of the present disclosure are not limited to the specific embodiments. One skilled in the art would understand that various modifications, amendments, alterations and variations can be made to the embodiments without departing from the spirit and scope of the present disclosure.

What is claimed is:

1. A flexible temperature sensor, comprising:
a flexible substrate;
an electrode arranged on the flexible substrate;
a mixed fluid arranged on the flexible substrate and in contact with the electrode, wherein the mixed fluid comprises an ionic liquid and porous conductive particles; and
a protective plate arranged on a surface of the flexible substrate having the mixed fluid to protect the mixed fluid.

2. The flexible temperature sensor of claim 1, wherein the porous conductive particles are porous black conductive particles.

3. The flexible temperature sensor of claim 1, wherein the porous conductive particles are two-dimensional graphene-like titanium carbide particles, graphene particles, carbon nanotube particles, or hollow spherical nickel particles.

4. The flexible temperature sensor of claim 1, wherein the ionic liquid is at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate.

5. The flexible temperature sensor of claim 4, wherein the flexible substrate comprises a polymer substrate, an ultra-thin glass substrate, a stainless steel substrate, a paper substrate or a biological composite substrate.

6. The flexible temperature sensor of claim 5, wherein the electrode is a metal film in a shape of comb, plate or well deposited on the flexible substrate.

7. The flexible temperature sensor of claim 6, wherein the metal film comprises a molybdenum film, an aluminum film, a copper film or a silver film.

8. The flexible temperature sensor of claim 4, wherein the protective plate comprises a polymer substrate, an ultra-thin glass substrate, a stainless steel substrate, a paper substrate or a biological composite film substrate.

9. The flexible temperature sensor of claim 4, wherein a retaining wall is arranged on the flexible substrate, and the mixed fluid is placed in a region surrounded by the retaining wall.

10. The flexible temperature sensor of claim 4, wherein the flexible temperature sensor further comprises a chip coupled to the electrode and for measuring current and processing the relationship between temperature and current.

11. A method for preparing a flexible temperature sensor of claim 1, comprising:
depositing a metal film on the flexible substrate, and performing exposure and etching to form an electrode;
inkjet printing or spraying the mixed fluid onto the flexible substrate and contacting the mixed fluid with the electrode; and
attaching a protective plate to the flexible substrate.

12. The method of claim 11, wherein the protective plate and the flexible substrate are bonded by an adhesive.

13. The method of claim 11, wherein the method further comprises binding a chip on the electrode.

14. The method of claim 13, wherein the chip is coupled to the electrode by a conductive paste.

15. The method of claim 11, wherein the ionic liquid is mixed with the porous conductive particles under vacuum.

16. The method of claim 11, wherein the porous conductive particles are two-dimensional graphene-like titanium carbide particles, graphene particles, carbon nanotube particles, or hollow spherical nickel particles.

17. The method of claim 11, wherein the ionic liquid is at least one of 1-ethyl-3-methylimidazolium tetrafluoroborate, 1-hexyl-3-methylimidazolium tetrafluoroborate, 1-benzyl-3-methylimidazolium tetrafluoroborate, 1-octyl-3-methylimidazolium acetate, 1-butyl-3-methylimidazolium acetate and 1-ethyl-3-methylimidazolium acetate.

18. The method of claim 11, wherein a retaining wall is arranged on the flexible substrate, and the mixed fluid is placed in a region surrounded by the retaining wall.

19. A flexible device comprising the flexible temperature sensor of claim 1.

20. The flexible device of claim 19, wherein a retaining wall is arranged on the flexible substrate, and the mixed fluid is placed in a region surrounded by the retaining wall.

* * * * *